(12) United States Patent
Kimura et al.

(10) Patent No.: US 9,082,725 B2
(45) Date of Patent: Jul. 14, 2015

(54) PATTERN FORMING METHOD

(75) Inventors: Masahiro Kimura, Kyoto (JP);
Tomonori Umezaki, Yamaguchi (JP);
Akiou Kikuchi, Yamaguchi (JP)

(73) Assignees: SCREEN Holdings Co., Ltd. (JP);
Central Glass Company, Limited (JP)

( * ) Notice: Subject to any disclaimer, the term of this patent is extended or adjusted under 35 U.S.C. 154(b) by 0 days.

(21) Appl. No.: 14/240,615

(22) PCT Filed: Aug. 16, 2012

(86) PCT No.: PCT/JP2012/070847
§ 371 (c)(1),
(2), (4) Date: Feb. 24, 2014

(87) PCT Pub. No.: WO2013/027653
PCT Pub. Date: Feb. 28, 2013

(65) Prior Publication Data
US 2014/0199852 A1 Jul. 17, 2014

(30) Foreign Application Priority Data
Aug. 25, 2011 (JP) ................... 2011-183900

(51) Int. Cl.
*H01L 21/311* (2006.01)
*H01L 21/302* (2006.01)
(Continued)

(52) U.S. Cl.
CPC .... *H01L 21/32135* (2013.01); *H01L 21/31116* (2013.01); *H01L 21/31144* (2013.01);
(Continued)

(58) Field of Classification Search
CPC .................. H01L 21/31116; H01L 21/31144; H01L 21/30604; H01L 21/32137; H01L 21/31138; H01L 21/30621
See application file for complete search history.

(56) References Cited

U.S. PATENT DOCUMENTS 4,310,380 A * 1/1982 Flamm et al. ................. 438/719
6,110,838 A * 8/2000 Loewenstein ................. 438/740
(Continued)

FOREIGN PATENT DOCUMENTS

JP 2-174271 7/1990
JP 3-114226 5/1991
(Continued)

OTHER PUBLICATIONS

International Search Report mailed Oct. 2, 2012 in corresponding PCT International Application No. PCT/JP2012/070847.
(Continued)

*Primary Examiner* — Duy Deo
(74) *Attorney, Agent, or Firm* — Ostrolenk Faber LLP

(57) ABSTRACT

A pattern forming method is provided for forming a pattern of a multilayer film including insulative films and electrically conductive films stacked together and having a hole formed therein on a substrate with the electrically conductive film being selectively accurately indented from an inner peripheral surface of the hole. The pattern forming method includes the steps of: alternately stacking at least two insulative films and at least two polysilicon films on a substrate to form a multilayer film including the at least two insulative films and the at least two polysilicon films; forming a hole extending through the at least two insulative films and the at least two polysilicon films in the multilayer film; and selectively etching the polysilicon films from a side wall of the hole through isotropic etching by feeding into the hole an etching gas prepared by diluting fluorine-containing halogen gas with an inert gas.

8 Claims, 7 Drawing Sheets

(51) Int. Cl.
*H01L 21/461* (2006.01)
*H01L 21/3213* (2006.01)
*H01L 29/66* (2006.01)
*H01L 29/792* (2006.01)
*H01L 27/115* (2006.01)
*H01L 21/67* (2006.01)
*H01L 21/306* (2006.01)

(52) U.S. Cl.
CPC ...... *H01L21/6719* (2013.01); *H01L 27/11578* (2013.01); *H01L 27/11582* (2013.01); *H01L 29/66833* (2013.01); *H01L 29/7926* (2013.01); *H01L 21/30604* (2013.01); *H01L 21/31138* (2013.01)

(56) References Cited

U.S. PATENT DOCUMENTS

| | | | |
|---|---|---|---|
| 6,719,808 | B1 | 4/2004 | Kim et al. .................. 438/710 |
| 2004/0185664 | A1* | 9/2004 | Kim et al. .................. 438/689 |
| 2008/0311751 | A1 | 12/2008 | Laermer et al. ............ 438/694 |
| 2009/0294828 | A1 | 12/2009 | Ozawa et al. ............... 257/319 |
| 2009/0321813 | A1 | 12/2009 | Kidoh et al. ............... 257/324 |
| 2010/0197129 | A1 | 8/2010 | Ishikawa .................... 438/591 |
| 2010/0240205 | A1* | 9/2010 | Son et al. .................... 438/588 |
| 2011/0057249 | A1 | 3/2011 | Nakao et al. ............... 257/324 |

FOREIGN PATENT DOCUMENTS

| | | |
|---|---|---|
| JP | 4-069964 | 3/1992 |
| JP | 2008-508704 | 3/2008 |
| JP | 2008-198629 | 8/2008 |
| JP | 2009-295617 | 12/2009 |
| JP | 2010-010596 | 1/2010 |
| JP | 2010-177652 | 8/2010 |
| JP | 2011-023586 | 3/2011 |
| JP | 2011-060991 | 3/2011 |
| KR | 10-0327341 | 2/2002 |

OTHER PUBLICATIONS

Written Opinion mailed Oct. 2, 2012 in corresponding PCT International Application No. PCT/JP2012/070847.
PCT Notification of Transmittal of Translation of the International Preliminary Search Report of Patentability, Form PCT/IB/338, mailed Mar. 6, 2014.
PCT Notification Concerning Transmittal of International Preliminary Report on Patentability, Form PCT/IB/326, mailed Mar. 6, 2014.

* cited by examiner

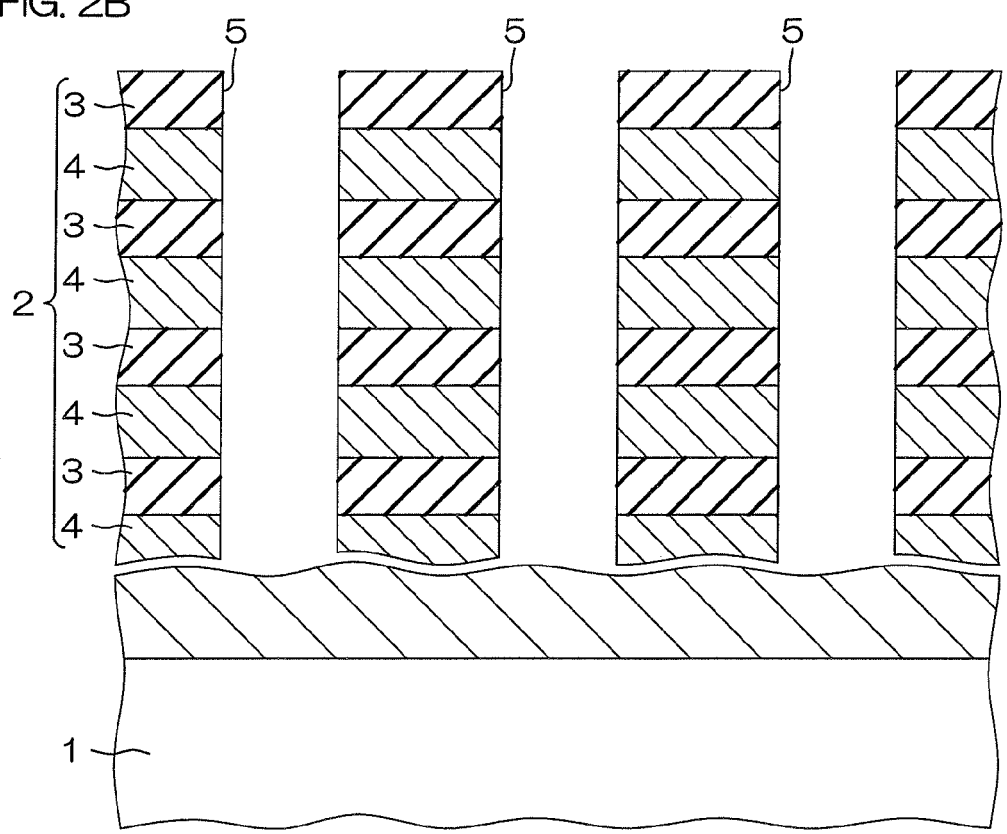

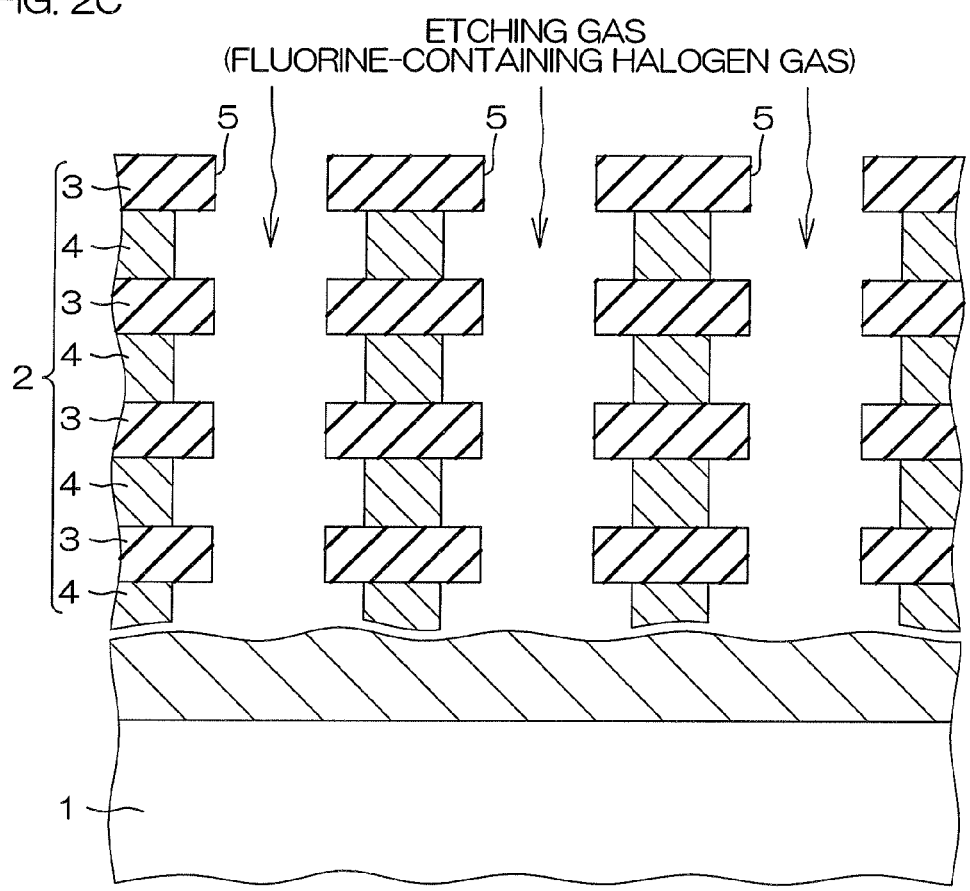

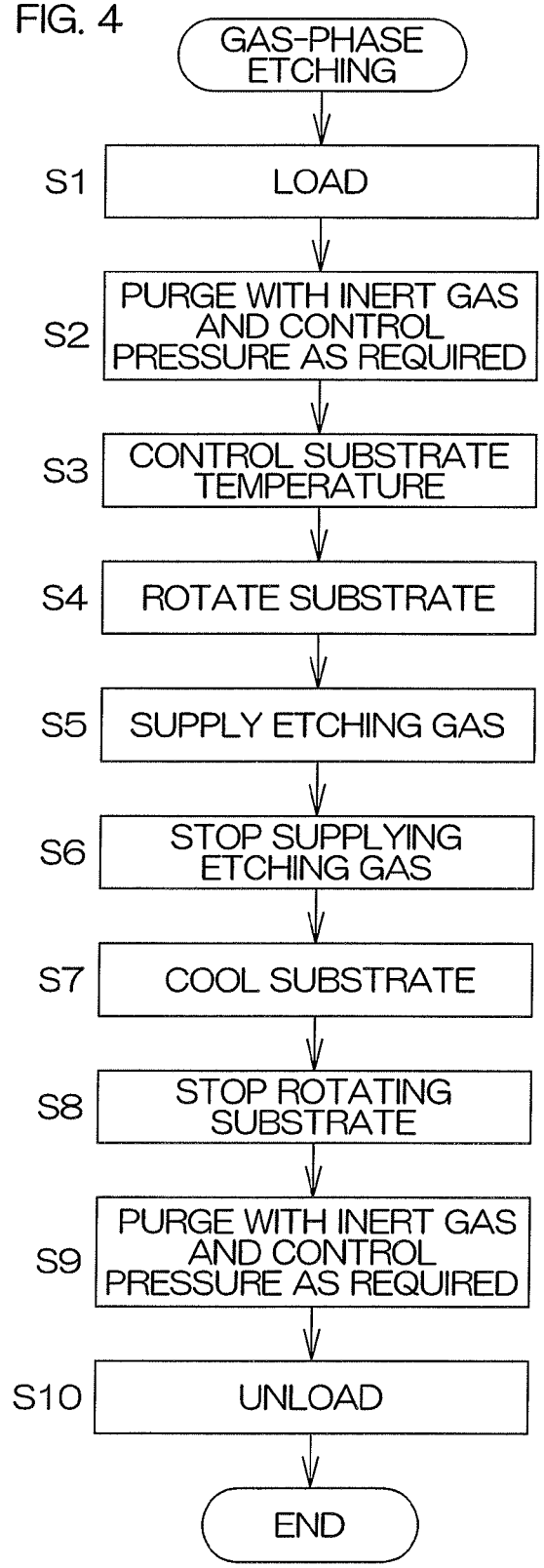

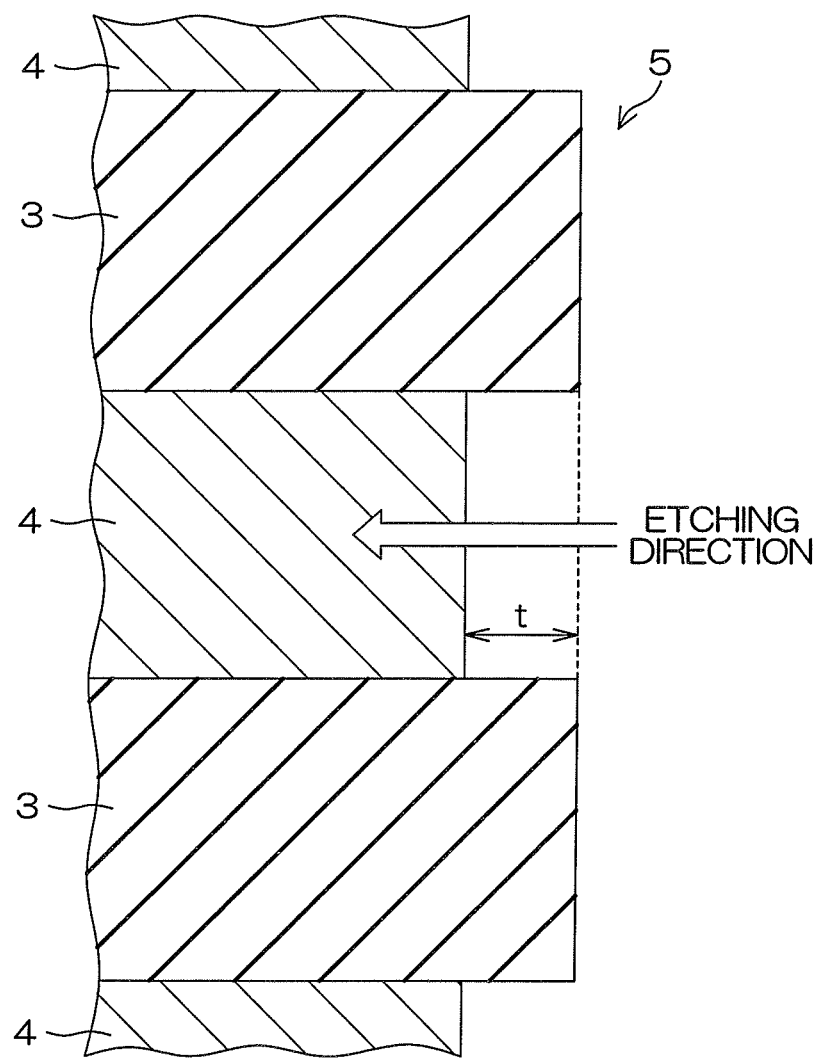

PATTERN FORMING METHOD

CROSS-REFERENCE TO RELATED APPLICATIONS

The present application is a 35 U.S.C. §§371 national phase conversion of PCT/JP2012/070847, filed Aug. 16, 2012, which claims priority to Japanese Patent Application No. 2011-183900, filed Aug. 25, 2011, the contents of both of which are incorporated herein by reference. The PCT International Application was published in the Japanese language.

TECHNICAL FIELD

The present invention relates to a method of forming a pattern on a substrate.

BACKGROUND ART

PTL1 discloses a production method for a three-dimensional memory cell array. More specifically, PTL1 discloses a method of forming a hole in a multilayer film including electrically conductive layers and insulative layers stacked alternately and repeatedly in a predetermined number of cycles so that the hole extends through the electrically conductive layers and the insulative layers. An insulative film having an ONO (Oxide-Nitride-Oxide) structure including a silicon nitride film sandwiched between a pair of silicon oxide films is provided on an inner peripheral surface of the hole, and a silicon pillar is embedded inside the hole. The silicon pillar functions as a channel, while the electrically conductive layers each function as a control gate. With this arrangement, a plurality of memory cells are provided which are isolated from each other by the insulative layers in the depthwise direction of the hole. The memory cells are each capable of accumulating electric charges in the insulative film of the ONO structure to store information.

CITATION LIST

Patent Literature

PTL1: JP2010-177652A

SUMMARY OF INVENTION

Technical Problem

The electrically conductive layers and the insulative layers are alternately exposed in the inner peripheral surface of the hole formed in the multilayer film, and the memory cells are isolated from each other by the insulative layers. If the electrically conductive layers can be indented from the inner peripheral surface of the hole by selectively etching the electrically conductive layers from the inner peripheral surface of the hole, it is possible to provide a structure such that the insulative layers project in the hole and the electrically conductive layers are isolated from each other by the projecting insulative layers. Thus, the memory cells can be isolated from each other. Where the memory cells are integrated at a higher density by thinning the respective layers, therefore, crosstalk between the memory cells can be suppressed.

However, no technique has been established to uniformly indent the electrically conductive layers in the hole irrespective of the depthwise position thereof.

It is therefore an object of the present invention to provide a pattern forming method for forming a pattern of a multilayer film including insulative films and electrically conductive films stacked together and having a hole formed therein on a substrate with the electrically conductive layers being selectively accurately indented from an inner peripheral surface of the hole.

Solution to Problem

According to an inventive aspect of claim 1 to achieve the object described above, there is provided a pattern forming method, which comprises the steps of: alternately stacking at least two insulative films and at least two polysilicon films on a substrate to form a multilayer film including the at least two insulative films and the at least two polysilicon films; forming a hole extending through the at least two insulative films and the at least two polysilicon films in the multilayer film; and selectively etching the polysilicon films from a side wall of the hole through isotropic etching by feeding into the hole an etching gas prepared by diluting a fluorine-containing halogen gas with an inert gas.

In this method, the multilayer film including the insulative films (e.g., silicon oxide films) and the polysilicon films alternately stacked is formed on the substrate, and the hole is formed in the multilayer film as extending through the multilayer film. Then, the etching gas prepared by diluting the fluorine-containing halogen gas with the inert gas is fed into the hole. With the etching gas, the isotropic etching proceeds from the inner peripheral surface of the hole. The etching gas has a higher etching selectivity ratio of the polysilicon films to the insulative films (e.g., silicon oxide films), making it possible to selectively etch the polysilicon films. Thus, the polysilicon films can be selectively indented from the inner peripheral surface (side wall) of the hole to provide a structure such that the insulative films project on the inner peripheral surface of the hole and the polysilicon films are isolated from each other by the projecting insulative films. The polysilicon films each serve as an electrically conductive layer.

The etching with the etching gas prepared by diluting the fluorine-containing halogen gas with the inert gas uniformly proceeds in the hole. That is, the etching can uniformly proceed irrespective of the depthwise position in the hole. In a wet etching process using an etching liquid, the etching liquid is easily refreshed in a mouth of the hole, but is not easily refreshed in an inner portion of the hole. Therefore, the etching rate differs in the mouth of the hole and in the inner portion of the hole, and is liable to provide an etching profile tapered toward the inner portion from the mouth of the hole. In the aforementioned etching process using the etching gas, in contrast, the etching can isotropically proceed wherever in the hole. Therefore, the polysilicon films can be accurately etched to be indented from the inner peripheral surface of the hole irrespective of the position in the hole.

As described in claim 2, the fluorine-containing halogen gas preferably comprises at least one gas selected from the group consisting of $ClF_3$ gas, $BrF_5$ gas, $IF_3$ gas, $IF_7$ gas, $ClF$ gas, $BrF_3$ gas, $IF_5$ gas and $BrF$ gas.

As described in claim 3, the selective etching step may be performed in an atmospheric pressure environment. With the use of the etching gas, the polysilicon films can be selectively etched in an environment having a near atmospheric pressure. Thus, there is no need to control the internal pressure of a treatment chamber in which the etching is carried out. This makes it possible to reduce the number of process steps, thereby correspondingly improving the productivity.

As described in claim 4, the selective etching step may be performed in a reduced pressure environment. This makes it possible to increase the etching rate and the etching selectivity ratio of the polysilicon films.

As described in claim 5, the selective etching step preferably includes the step of rotating the substrate about a rotation axis perpendicular to a major surface of the substrate. Where a plurality of holes are provided within a plane of the substrate, this suppresses uneven treatment within the plane of the substrate.

As described in claim 6, the selective etching step preferably includes the step of controlling the temperature of the substrate (heating or cooling the substrate). This makes it possible to control the etching rate and the etching selectivity ratio of the polysilicon films.

As described in claim 7, the temperature of the substrate is preferably controlled at not lower than −30° C. and not higher than 30° C. during the etching in the substrate temperature controlling step (substrate heating or cooling step). This makes it possible to increase the etching rate and the etching selectivity ratio of the polysilicon films.

As described in claim 8, the insulative films may each comprise an oxide film (e.g., a silicon oxide film). In the gas-phase etching process using the fluorine-containing halogen gas, the selectivity ratio of the polysilicon films to the oxide film can be increased. Where the insulative films each comprise the oxide film, therefore, the polysilicon films can be more accurately etched.

BRIEF DESCRIPTION OF DRAWINGS

FIG. 2B is a sectional view showing a process step subsequent to the step shown in FIG. 2A.

FIG. 2C is a sectional view showing a process step subsequent to the step shown in FIG. 2B.

FIG. 4 is a flow chart for explaining the gas-phase etching process to be performed by the gas-phase etching apparatus in detail.

FIG. 5 is an enlarged partial sectional view schematically showing an etching state observed in an etching test.

DESCRIPTION OF EMBODIMENTS

An embodiment of the present invention will hereinafter be described in detail with reference to the attached drawings.

Figure 1:
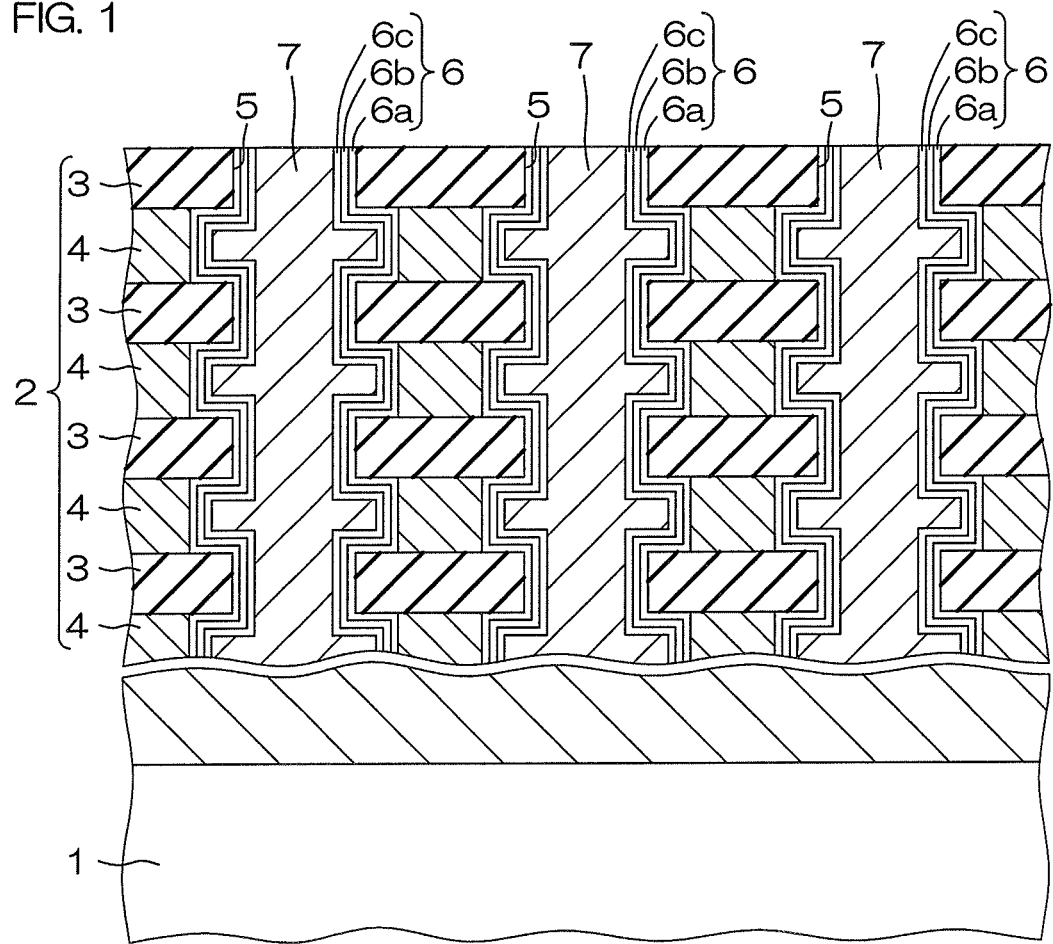
FIG. 1 is a partial sectional view showing the construction of a semiconductor device to which a pattern forming method according to one embodiment of the present invention is applied.

FIG. 1 is a partial sectional view showing the construction of a semiconductor device to which a pattern forming method according to an embodiment of the present invention is applied. The semiconductor device includes a three-dimensional memory cell array. The semiconductor device includes a semiconductor substrate 1, and a multilayer film 2 provided on the semiconductor substrate 1. The multilayer film 2 includes oxide films 3 (each serving as an insulative film) and polysilicon films 4 (each serving as an electrically conductive film) which are stacked alternatively and repeatedly in a plurality of cycles. The multilayer film 2 includes at least two oxide films 3. Further, the multilayer film 2 includes at least two polysilicon films 4. The multilayer film 2 has a hole 5 extending through the oxide films 3 and the polysilicon films 4 in a stacking direction. The hole 5 has a column shape. The hole 5 may have a round column shape or a polygonal column shape (e.g., rectangular column shape). In an inner peripheral surface (side wall) of the hole 5, the oxide films 3 project inward from the polysilicon films 4. In other words, inner rims of the polysilicon films 4 are indented from inner rims of the oxide films 3. A plurality of such holes 5 are provided in the multilayer film 2 to be distributed within a plane of the semiconductor substrate 1.

A charge storage multilayer film 6 of an ONO (Oxide-Nitride-Oxide) structure is provided on the inner peripheral surface of each of the holes 5. The charge storage multilayer film 6 has a multilayer structure including, for example, an oxide film 6a (e.g., a silicon oxide film) provided in contact with the inner peripheral surface of the hole 5, a nitride film 6b (e.g., a silicon nitride film) provided in contact with the oxide film 6a and an oxide film 6c (e.g., a silicon oxide film) provided in contact with the nitride film 6b. The inside of the hole 5 defined by the charge storage multilayer film 6 is filled with a silicon pillar 7 embedded therein.

With this arrangement, the silicon pillar 7 functions as a channel, and the polysilicon films 4 each function as a control gate. Thus, a plurality of memory cells are provided which are isolated from each other in the depthwise direction of the hole 5 by the oxide films 3. The memory cells are each capable of accumulating electric charges in the charge storage multilayer film 6 to store information. Since the oxide films 3 which isolate the memory cells from each other project inward of the polysilicon films 4 in the hole 5, the isolation of the memory cells can be reliably achieved. Where the memory cells are integrated at a higher density by thinning the oxide films 3 and the polysilicon films 4, crosstalk between the memory cells can be suppressed.

Figure 2A:
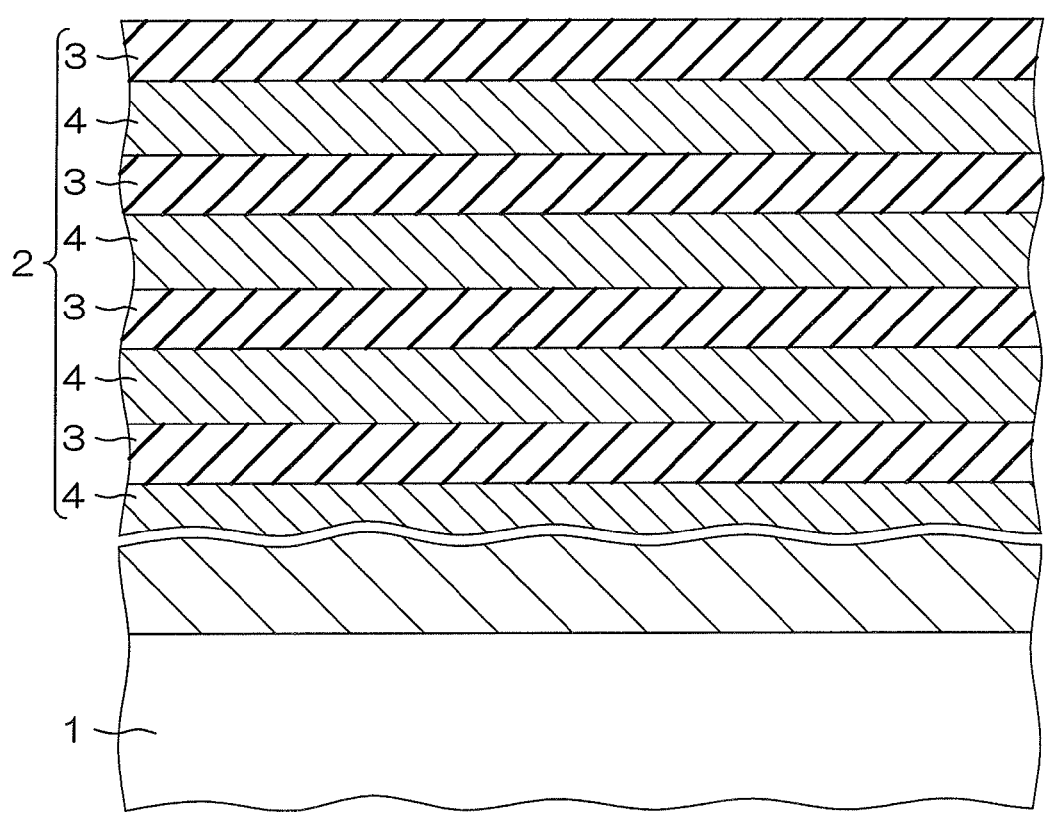
FIG. 2A is a sectional view for explaining a production method for the semiconductor device.

FIGS. 2A, 2B and 2C are sectional views for explaining a production method for the semiconductor device.

First, as shown in FIG. 2A, oxide films 3 and polysilicon films 4 are alternately stacked on a semiconductor substrate 1 to form a multilayer film 2. The oxide films 3 may be formed of TEOS (tetraethoxysilane), for example, by a CVD process (chemical vapor deposition process). The polysilicon films 4 may be formed, for example, by a plasma CVD process. The polysilicon films 4 are formed while being doped with an impurity to be imparted with electrical conductivity. Thus, the polysilicon films 4 can serve as electrically conductive films.

Then, as shown in FIG. 2B, holes 5 are formed in the multilayer film as extending through the oxide films 3 and the polysilicon films 4 in a film stacking direction. The formation of the holes 5 may be achieved, for example, by a reactive ion etching process. More specifically, a method disclosed in PTL1 may be employed.

Subsequently, as shown in FIG. 2C, the polysilicon films 4 are selectively etched from inner peripheral surfaces (side walls) of the holes 5 through isotropic etching by feeding an etching gas into the holes 5 (gas-phase etching step). Thus, the polysilicon films 4 are indented from the inner peripheral surfaces of the holes 5. This provides a structure such that the oxide films 3 project inward of the inner peripheral surfaces (side walls) of the holes 5. A gas prepared by diluting a fluorine-containing halogen gas with an inert gas is used as the etching gas. Since this etching gas has a higher etching selectivity ratio of the polysilicon to the oxide, it is possible to selectively etch the polysilicon films 4.

Examples of the fluorine-containing halogen gas include $ClF_3$ gas, $BrF_5$ gas, $IF_3$ gas, $IF_7$ gas, $ClF$ gas, $BrF_3$ gas, $IF_5$ gas and $BrF$ gas, which may be used either alone or in combination. Examples of the inert gas to be used for diluting the fluorine-containing halogen gas include nitrogen gas, argon gas and helium gas.

Since no etching residue remains on a surface of the substrate after the gas-phase etching step using the aforementioned etching gas, there is no need to perform a rinsing step with the use of a rinse liquid such as pure water. For example, a reaction for etching silicon with $ClF_3$ gas is expressed by the following formula. Since $SiF_4$ and $ClF$ are both volatile, silicon can be etched without any etching residue.

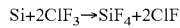

$$Si+2ClF_3 \rightarrow SiF_4+2ClF$$

The process step of FIG. 2C is followed by formation of charge storage multilayer films 6 and embedment of silicon pillars 7, whereby the structure shown in FIG. 1 is provided. The formation of the charge storage multilayer films 6 may be achieved by an ALD (Atomic Layer Deposition) process. Further, the embedment of the silicon pillars 7 may be achieved by depositing silicon through a CVD process while doping silicon with an impurity.

Figure 3:
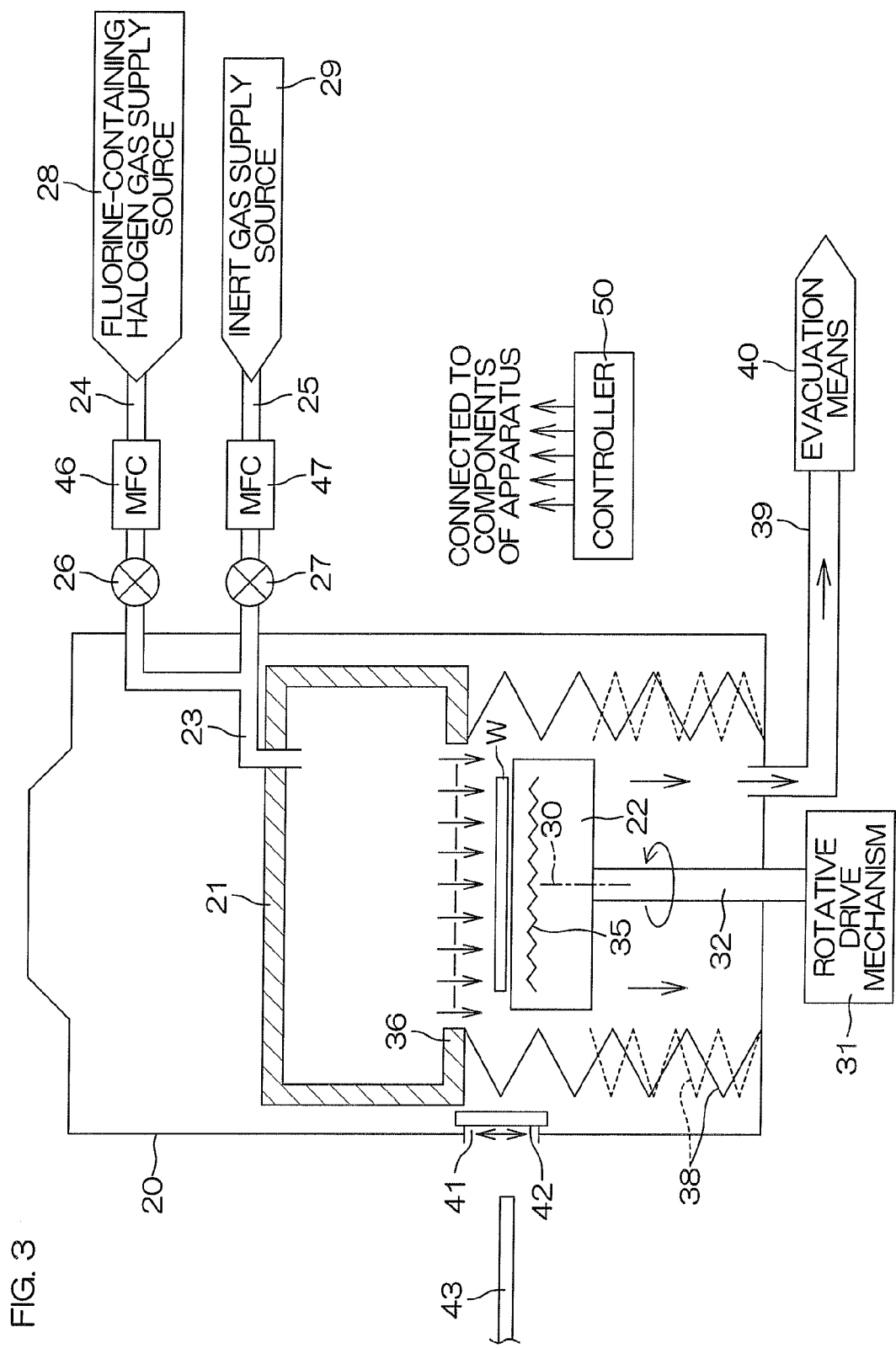
FIG. 3 is a schematic sectional view showing the construction of an exemplary gas-phase etching apparatus which performs a gas-phase etching process for selectively etching polysilicon films from an inner peripheral surface (side wall) of a hole to indent the polysilicon films.

FIG. 3 is a schematic sectional view showing the construction of an exemplary gas-phase etching apparatus which performs the step of selectively etching the polysilicon films 4 from the inner peripheral surfaces (side walls) of the holes 5 to indent the polysilicon films 4.

The gas-phase etching apparatus includes a housing 20, a treatment gas feeding vessel 21 provided in the housing 20, and a substrate holding base 22 provided in the housing 20. A treatment gas is fed into the treatment gas feeding vessel 21 from a treatment gas feeding passage 23. A fluorine-containing halogen gas supply passage 24 and an inert gas supply passage 25 are connected to the treatment gas feeding passage 23. A valve 26 and a flow rate controller (MFC) 46 are provided in the fluorine-containing halogen gas supply passage 24. Similarly, a valve 27 and a flow rate controller (MFC) 47 are provided in the inert gas supply passage 25. The fluorine-containing halogen gas supply passage 24 is connected to a fluorine-containing halogen gas supply source 28. The inert gas supply passage 25 is connected to an inert gas supply source 29.

The treatment gas feeding vessel 21 includes a punching plate 36 provided as a bottom wall thereof. The punching plate 36 is disposed above the substrate holding base 22. The punching plate 36 has a plurality of through-holes uniformly distributed therein for communication between upper and lower spaces located above and below the punching plate 36. The treatment gas fed into the treatment gas feeding vessel 21 flows through the punching plate 36 toward the substrate holding base 22.

The substrate holding base 22 is provided in the form of a spin chuck which is capable of horizontally holding a substrate W and rotating the substrate W about a vertical rotation axis 30. The substrate W corresponds to the semiconductor substrate 1 shown in FIG. 1 and the like. The treatment gas flowing through the punching plate 36 is fed to the substrate W held by the substrate holding base 22. The substrate holding base 22 is fixed to an upper end of a rotation shaft 32 which is rotated about the rotation axis 30 by a rotative drive mechanism 31 including a motor and the like. Further, a temperature controller 35 that controls the temperature of the substrate W is incorporated in the substrate holding base 22. The temperature controller 35 is a device which heats and cools the substrate W held by the substrate holding base 22.

A bellows 38 vertically contractible with respect to a bottom of the housing 20 is provided outward around the substrate holding base 22 as seen in plan. The bellows 38 is driven to be elongated and contracted by a drive mechanism not shown to locate its upper edge at an enclosed position (indicated by a solid line in FIG. 3) at which a space around the substrate holding base 22 is enclosed to define a treatment chamber with the upper edge in abutment against a lower surface peripheral portion of the punching plate 36 and at a retracted position (indicated by a broken line in FIG. 3) at which the upper edge is retracted at a level lower than an upper surface of the substrate holding base 22.

The internal space of the bellows 38 can be evacuated through an evacuation pipe 39 connected to the bottom of the housing 20 by evacuation means 40. The evacuation means 40 may be a power evacuation mechanism such as an evacuation blower or an ejector, or may be an evacuation facility provided in a clean room in which the gas-phase etching apparatus is disposed.

The housing 20 has an opening 41 provided in a side wall thereof on a lateral side of the substrate holding base 22 for loading and unloading the substrate W. A shutter 42 is provided in the opening 41. When the substrate W is loaded, the bellows 38 is lowered to the retracted position (indicated by the broken line in FIG. 3), and the shutter 42 is opened. In this state, the substrate W is transferred to the substrate holding base 22 by a substrate transport robot 43. When the substrate W is unloaded, the bellows 38 is located at the retracted position, and the shutter 42 is opened. In this state, the substrate W is transferred from the substrate holding base 22 to the substrate transport robot 43.

The components of the gas-phase etching apparatus are controlled by a controller 50 including a microcomputer and the like. More specifically, the controller 50 controls the opening and closing operation of the valves 26, 27, the operation of the rotative drive mechanism 31, the operation of the temperature controller 35, the up and down movement of the bellows 38, the operation of the evacuation means 40, the operation of the substrate transport robot 43, the flow rates to be regulated by the flow rate controllers 46, 47, and the like.

When the gas-phase etching process is to be performed on the substrate W, the bellows 38 is moved up to the enclosed position (indicated by the solid line in FIG. 3) into intimate contact with the peripheral portion of the punching plate 36, and the valves 26, 27 are opened. Thus, the fluorine-containing halogen gas supplied from the fluorine-containing halogen gas supply passage 24 is diluted with the inert gas (e.g., nitrogen gas) supplied from the inert gas supply passage 25 to prepare the etching gas. The etching gas is fed into the treatment gas feeding vessel 21 from the treatment gas feeding passage 23 and then to the punching plate 36. Then, the etching gas is supplied to a surface of the substrate W through the through-holes of the punching plate 36.

On the other hand, the etching rate and the etching selectivity ratio with the etching gas described above are dependent on the substrate temperature. Therefore, the controller 50 controls the temperature controller 35 to control the temperature of the substrate W.

In order to uniformly treat the substrate W within the plane of the substrate W, the controller 50 drives the rotative drive mechanism 31 to rotate the substrate holding base 22 about the rotation axis 30 at a predetermined speed.

FIG. 4 is a flow chart for explaining in detail the gas-phase etching process to be performed by the gas-phase etching apparatus.

After the substrate W is loaded into the apparatus from the opening 41 by the substrate transport robot 43 and the shutter 42 is closed, the controller 50 moves up the bellows 38 into abutment against the punching plate 36 to define the treatment chamber in the enclosed state (Step S1). Then, the controller 50 drives the evacuation means 40 to evacuate the treatment chamber, and opens the valve 27 to feed the inert gas to the treatment chamber, whereby the internal atmosphere of the treatment chamber is purged with the inert gas (Step S2). The controller 50 may control the evacuation means 40 to maintain the internal atmosphere of the treatment chamber at an atmospheric pressure. As required, the controller 50 may control the evacuation means 40 to maintain the internal atmosphere of the treatment chamber at a reduced pressure (at a pressure lower than the atmospheric pressure). Further, the controller 50 controls the temperature controller 35 to control the temperature of the substrate W (Step S3), and controls the rotative drive mechanism 31 to rotate the substrate holding base 22 (i.e., to rotate the substrate W) (Step S4). The temperature of the substrate W is preferably controlled in a range from an ordinary temperature to about 80° C.

In this state, the controller 50 opens the valve 26, and further controls the flow rate controllers 46, 47. Thus, an etching gas is prepared by mixing the fluorine-containing halogen gas and the inert gas in a predetermined flow rate ratio, and fed into the treatment chamber (Step S5). The etching gas is fed to the surface of the substrate W to enter the holes 5 of the multilayer film formed on the surface of the substrate W, whereby the polysilicon films 4 are selectively etched from the inner peripheral surfaces (side walls) of the holes 5. This gas-phase etching process is performed for a predetermined period.

Then, the controller 50 closes the valve 26 to stop supplying the fluorine-containing halogen gas. Thus, the supply of the etching gas is stopped, whereby only the inert gas is fed into the treatment chamber (Step S6). Further, the controller 50 controls the temperature controller 35 to cool the substrate W (Step S7). Thus, the gas-phase etching process ends.

Thereafter, the controller 50 controls the rotative drive mechanism 31 to stop rotating the substrate W (Step S8). Then, the inside of the treatment chamber is purged with the inert gas (Step S9). Where the internal atmosphere of the treatment chamber is controlled to be maintained at the reduced pressure during the gas-phase etching process, the controller 50 controls the evacuation means 40 to return the internal atmosphere of the treatment chamber to the atmospheric pressure.

In turn, the controller 50 moves down the bellows 38, and opens the shutter 42. In this state, the treated substrate W is unloaded by the substrate transport robot 43 (Step S10).

In this embodiment, as described above, the etching gas prepared by diluting the fluorine-containing halogen gas with the inert gas is fed into the holes 5 formed in the multilayer film 2. With the etching gas, the isotropic etching proceeds from the inner peripheral surfaces (side walls) of the holes 5. The etching gas has a higher etching selectivity ratio of the polysilicon films 4 to the oxide films 3, making it possible to selectively etch the polysilicon films 4. Thus, the polysilicon films 4 can be selectively indented from the inner peripheral surfaces of the holes 5. This provides a structure such that the oxide films 3 project on the inner peripheral surfaces of the holes 5 and the polysilicon films 4 (electrically conductive layers) are isolated from each other by the projecting oxide films 3.

The gas-phase etching process using the etching gas prepared by diluting the fluorine-containing halogen gas with the inert gas uniformly proceeds in the holes 5. That is, the uniform etching can be achieved irrespective of the depth position in the holes 5. In a wet etching process, for example, an etching liquid is easily refreshed in a mouth of the hole, but is not easily refreshed in an inner portion of the hole. Therefore, the etching rate differs in the mouth of the hole and in the inner portion of the hole, and is liable to provide an etching profile tapered toward the inner portion from the mouth of the hole. In the aforementioned gas-phase etching process, in contrast, the etching can isotropically proceed wherever in the holes. Therefore, the polysilicon films 4 can be accurately etched to be indented from the inner peripheral surfaces of the holes 5 irrespective of the position in the holes 5.

Further, no etching residue remains on the surface of the substrate W after the gas-phase etching step. This obviates the need for performing a rinsing step with the use of a rinse liquid such as pure water after the gas-phase etching step. By obviating the step using the rinse liquid, a minute pattern formed on the substrate W is prevented from being collapsed by a surface tension of the rinse liquid.

As described above, the gas-phase etching may be performed in an atmospheric pressure environment or, as required, in a reduced pressure environment. Where the gas-phase etching is performed in the atmospheric pressure environment, there is no need to control the pressure in the treatment chamber. This makes it possible to reduce the number of process steps, thereby correspondingly improving the productivity. Where the gas-phase etching is performed in the reduced pressure environment, it is possible to increase the etching rate and the etching selectivity ratio of the polysilicon films.

In this embodiment, the substrate W is rotated about the rotation axis 30 perpendicular to the major surface thereof in the gas-phase etching step. Thus, the gas-phase etching can be uniformly performed in the plurality of holes 5 which are formed in the multilayer film 2 to be distributed within the plane of the substrate W. Therefore, highly uniform structures can be accurately formed in the respective holes 5.

In this embodiment, the temperature of the substrate W is controlled in the gas-phase etching step. In order to increase the etching rate and the etching selectivity ratio of the polysilicon films, the temperature of the substrate W is preferably controlled at not lower than −30° C. and not higher than 30° C., particularly preferably at not lower than −10° C. and not higher than 20° C. Thus, the selective etching of the polysilicon films 4 can be more accurately carried out.

Since the oxide films 3 are provided as the insulative films between the polysilicon films 4, a greater selectivity ratio can be ensured in the gas-phase etching. This makes it possible to further accurately etch the polysilicon films 4.

Specific test conditions and test results will hereinafter be described.

Examples 1 to 15

A substrate formed with a pattern as shown in FIG. 2B was placed on the substrate holding base 22 of the gas-phase etching apparatus having the construction shown in FIG. 3, and an etching test was performed. A silicon etching state observed in this test is shown in FIG. 5. Etching depths t of the respective polysilicon films 4 in a side wall of a hole 5 were measured through observation of sections by SEM. Further, an average $t_A$ and a standard deviation σ of the etching depths t were determined. Then $σ/t_A$ was determined to evaluate the uniformity of the etching depth in the depthwise direction of the hole. The flow rate of a fluoride gas fed as the etching gas was 100 sccm.

Etching conditions employed in inventive examples and the results are shown in Table 1.

TABLE 1

| | Fluoride gas | | Diluent gas | | | Hole | | Average | Standard | |
|---|---|---|---|---|---|---|---|---|---|---|
| | Type | Partial pressure | Type | Partial pressure | Substrate temperature | diameter D | Etching period | etching depth $t_A$ | deviation $\sigma$ | $\sigma/t_A$ |
| Example 1 | $IF_7$ | 5 Pa | He | 95 Pa | 15° C. | 100 nm | 10 min. | 25 nm | 2.8 | 11% |
| Example 2 | $ClF_3$ | 5 Pa | He | 95 Pa | 15° C. | 100 nm | 10 min. | 21 nm | 2.6 | 12% |
| Example 3 | $IF_7$ | 5 Pa | He | 1000 Pa | 15° C. | 100 nm | 10 min. | 23 nm | 2.5 | 11% |
| Example 4 | $ClF_3$ | 5 Pa | He | 1000 Pa | 15° C. | 100 nm | 10 min. | 20 nm | 2.4 | 12% |
| Example 5 | $IF_7$ | 5 Pa | Ar | 95 Pa | 15° C. | 100 nm | 10 min. | 24 nm | 2.8 | 12% |
| Example 6 | $ClF_3$ | 5 Pa | Ar | 95 Pa | 15° C. | 100 nm | 10 min. | 20 nm | 2.4 | 12% |
| Example 7 | $IF_7$ | 5 Pa | $N_2$ | 95 Pa | 15° C. | 100 nm | 10 min. | 25 nm | 2.8 | 11% |
| Example 8 | $ClF_3$ | 5 Pa | $N_2$ | 95 Pa | 15° C. | 100 nm | 10 min. | 20 nm | 2.2 | 11% |
| Example 9 | $IF_7$ | 1 Pa | He | 99 Pa | 15° C. | 100 nm | 30 min. | 20 nm | 2.5 | 13% |
| Example 10 | $ClF_3$ | 1 Pa | He | 99 Pa | 15° C. | 100 nm | 30 min. | 19 nm | 2.5 | 13% |
| Example 11 | $IF_7$ | 50 Pa | He | 50 Pa | 15° C. | 100 nm | 4 min. | 21 nm | 2.4 | 11% |
| Example 12 | $ClF_3$ | 50 Pa | He | 50 Pa | 15° C. | 100 nm | 4 min. | 24 nm | 2.8 | 12% |
| Example 13 | $IF_7$ | 5 Pa | He | 95 Pa | 30° C. | 100 nm | 10 min. | 25 nm | 2.9 | 12% |
| Example 14 | $IF_7$ | 5 Pa | He | 95 Pa | 0° C. | 100 nm | 10 min. | 27 nm | 2.7 | 10% |
| Example 15 | $IF_7$ | 5 Pa | He | 95 Pa | −10° C. | 100 nm | 10 min. | 29 nm | 2.7 | 9% |

In Example 1, the etching test was performed for 10 minutes under fixed conditions at a substrate temperature of 15° C. with the use of $IF_7$ as the fluoride gas at an $IF_7$ partial pressure of 5 Pa and with the use of He as the diluent gas at a He partial pressure of 95 Pa. As a result, the uniformity was excellent with an average etching depth $t_A$ of 25 nm, a standard deviation $\sigma$ of 2.8 and $\sigma/t_A$ of 11%.

In Example 2, the etching test was performed in substantially the same manner as in Example 1, except that $ClF_3$ was used as the fluoride gas. As a result, the uniformity was excellent with an average etching depth $t_A$ of 21 nm, a standard deviation $\sigma$ of 2.6 and $\sigma/t_A$ of 12%.

In Examples 3 and 4, the etching test was performed in substantially the same manner as in Examples 1 and 2, except that the He partial pressure was 1000 Pa. As a result, the uniformity was excellent with an average etching depth $t_A$ of 23 nm, a standard deviation $\sigma$ of 2.5 and $\sigma/t_A$ of 11% in Example 3 and with an average etching depth $t_A$ of 20 nm, a standard deviation $\sigma$ of 2.4 and $\sigma/t_A$ of 12% in Example 4.

In Examples 5 and 6, the etching test was performed in substantially the same manner as in Examples 1 and 2, except that Ar was used as the diluent gas. In Examples 7 and 8, the etching test was performed in substantially the same manner as in Examples 1 and 2, except that $N_2$ was used as the diluent gas. As a result, the uniformity was excellent with $\sigma/t_A$ of 11 to 12%.

In Examples 9 and 10, the etching test was performed in substantially the same manner as in Examples 1 and 2, except that the fluoride gas partial pressure and the diluent gas partial pressure were 1 Pa and 99 Pa, respectively, and the etching period was 30 minutes. As a result, the uniformity was excellent with $\sigma/t_A$ of 13%.

In Examples 11 and 12, the etching test was performed in substantially the same manner as in Examples 1 and 2, except that the fluoride gas partial pressure and the diluent gas partial pressure were 50 Pa and 50 Pa, respectively, and the etching period was 4 minutes. As a result, the uniformity was excellent with $\sigma/t_A$ of 11 to 12%.

In Example 13, the etching test was performed in substantially the same manner as in Example 1, except that the substrate temperature was 30° C. As a result, the uniformity was excellent with $\sigma/t_A$ of 12%.

In Example 14, the etching test was performed in substantially the same manner as in Example 1, except that the substrate temperature was 0° C. As a result, the uniformity was excellent with $\sigma/t_A$ of 10%.

In Example 15, the etching test was performed in substantially the same manner as in Example 1, except that the substrate temperature was −10° C. As a result, the uniformity was excellent with $\sigma/t_A$ of 9%.

Comparative Example 1

Etching conditions employed in Comparative example 1 are shown in Table 2.

TABLE 2

| | Fluoride gas | | Diluent gas | | | Hole | | Average | Standard | |
|---|---|---|---|---|---|---|---|---|---|---|
| | Type | Partial pressure | Type | Partial pressure | Substrate temperature | diameter D | Etching period | etching depth $t_A$ | deviation $\sigma$ | $\sigma/t_A$ |
| Comparative Example 1 | $F_2$ | 5 Pa | He | 95 Pa | 30° C. | 100 nm | 10 min. | No etching | — | — |

In Comparative Example 1, the etching test was performed in substantially the same manner as in Example 1, except that $F_2$ was used as the fluoride gas. As a result, the etching of the polysilicon films did not proceed.

While one embodiment of the present invention has thus been described, the invention may be embodied in other ways. Various modifications may be made within the scope of the present invention defined by the appended claims.

REFERENCE SIGNS LIST

1, W: SEMICONDUCTOR SUBSTRATE
2: MULTILAYER FILM
3: OXIDE FILM
4: POLYSILICON FILM
5: HOLE
6: CHARGE STORAGE MULTILAYER FILM

7: SILICON PILLAR
20: HOUSING
21: TREATMENT GAS FEEDING VESSEL
22: SUBSTRATE HOLDING BASE
23: TREATMENT GAS FEEDING PASSAGE
24: FLUORINE-CONTAINING HALOGEN GAS SUPPLY PASSAGE
25: INERT GAS SUPPLY PASSAGE
26, 27: VALVES
28: FLUORINE-CONTAINING HALOGEN GAS SUPPLY SOURCE
29: INERT GAS SUPPLY SOURCE
30: ROTATION AXIS
31: ROTATIVE DRIVE MECHANISM
32: ROTATION SHAFT
35: TEMPERATURE CONTROLLER
36: PUNCHING PLATE
38: BELLOWS
39: EVACUATION PIPE
40: EVACUATION MEANS
41: OPENING
42: SHUTTER
43: SUBSTRATE TRANSPORT ROBOT
46, 47: FLOW RATE CONTROLLERS
50: CONTROLLER

The invention claimed is:

1. A pattern forming method comprising the steps of:
    alternately stacking at least two insulative films and at least two polysilicon films on a substrate to form a multilayer film including the at least two insulative films and the at least two polysilicon films;
    forming a hole extending through the at least two insulative films and the at least two polysilicon films in the multilayer film; and
    selectively etching the polysilicon films from a side wall of the hole through isotropic etching by feeding into the hole an etching gas prepared by diluting a fluorine-containing halogen gas with an inert gas, such that a ratio $\sigma/t_A$ of a standard deviation $\sigma$ of etching depths of the respective polysilicon films in a side wall of the hole after the selective etching, with respect to an average $t_A$ of the etching depths, is in a range from 9% to 13%.

2. The pattern forming method according to claim 1, wherein the fluorine-containing halogen gas comprises at least one gas selected from the group consisting of $ClF_3$ gas, $BrF_5$ gas, $IF_3$ gas, $IF_7$ gas, $ClF$ gas, $BrF_3$ gas, $IF_5$ gas and $BrF$ gas.

3. The pattern forming method according to claim 1, wherein the selective etching step is performed in an atmospheric pressure environment.

4. The pattern forming method according to claim 1, wherein the selective etching step is performed in a reduced pressure environment.

5. The pattern forming method according to claim 1, wherein the selective etching step includes the step of rotating the substrate about a rotation axis perpendicular to a major surface of the substrate.

6. The pattern forming method according to claim 1, wherein the selective etching step includes the step of controlling a temperature of the substrate.

7. The pattern forming method according to claim 6, wherein the temperature of the substrate is controlled at not lower than −30° C. and not higher than 30° C. during the etching in the substrate temperature controlling step.

8. The pattern forming method according to claim 1, wherein the insulative films each comprise an oxide film.

* * * * *